(12) United States Patent
Kajimura et al.

(10) Patent No.: US 7,446,067 B2
(45) Date of Patent: Nov. 4, 2008

(54) CERAMIC GREEN SHEET AND CERAMIC SUBSTRATE

(75) Inventors: Masahiro Kajimura, Daito (JP); Hideki Yoshikawa, Takarazuka (JP)

(73) Assignee: Sanyo Electric Co., Ltd., Morguchi (JP)

( * ) Notice: Subject to any disclaimer, the term of this patent is extended or adjusted under 35 U.S.C. 154(b) by 0 days.

(21) Appl. No.: 11/640,384

(22) Filed: Dec. 18, 2006

(65) Prior Publication Data
US 2007/0142530 A1 Jun. 21, 2007

(30) Foreign Application Priority Data

| Dec. 20, 2005 | (JP) | 2005-366663 |
| Dec. 20, 2005 | (JP) | 2005-366664 |
| Jun. 30, 2006 | (JP) | 2006-181719 |
| Dec. 7, 2006 | (JP) | 2006-330460 |

(51) Int. Cl.
C04B 35/00 (2006.01)
B32B 3/00 (2006.01)
B32B 18/00 (2006.01)

(52) U.S. Cl. .................. 501/128; 501/127; 428/210

(58) Field of Classification Search .............. 501/127, 501/128
See application file for complete search history.

(56) References Cited

U.S. PATENT DOCUMENTS 6,610,621 B2 * 8/2003 Masuko .................. 501/32

FOREIGN PATENT DOCUMENTS

| JP | 9-67159 A | 3/1997 |
| JP | 9-235154 A | 9/1997 |
| JP | 9-278516 A | 10/1997 |
| JP | 3220360 B | 8/2001 |
| JP | 2003-95732 A | 4/2003 |
| JP | 2004-256384 A | 9/2004 |
| JP | 2005-145722 A | 6/2005 |
| JP | 2006-181719 | 6/2006 |
| JP | 2006-330460 | 12/2006 |

* cited by examiner

*Primary Examiner*—Jerry Lorengo
*Assistant Examiner*—Kevin M Johnson
(74) *Attorney, Agent, or Firm*—NDQ&M Watchstone LLP; Vincent M. DeLuca

(57) ABSTRACT

A ceramic green sheet of the invention contains an inorganic powder and an organic resin and is characterized in that the inorganic powder contains 72 to 98% by weight of aluminum oxide, 1 to 12% by weight of copper oxide, 0.1 to 3% by weight of titanium oxide, and 0.25 to 10% by weight of silicon oxide based on 100% by weight of the total weight of the inorganic powder.

6 Claims, 3 Drawing Sheets

(a)

(b)

(c)

CERAMIC GREEN SHEET AND CERAMIC SUBSTRATE

BACKGROUND OF THE INVENTION

1. Field of the Invention

The invention relates to a ceramic green sheet and a ceramic substrate.

2. Description of the Related Art

Recently, in mobile communication appliances and portable communication terminals such as a cell phone, a circuit module using a multilayer ceramic substrate has been employed in place of a conventional module which mounts capacitors and inductors on the surface of a printed board. With respect to the multilayered ceramic substrate, a wiring line, an L component, and a C component are formed by forming prescribed conductive patterns to actualize high density wiring. Use of the multilayer ceramic substrate makes it possible to decrease the number of inductors and capacitors to be mounted as discrete components (surface mount devices), so that the circuit module can be miniaturized.

Materials to be used for the multilayered ceramic substrate can be classified into mainly two types; HTCC (High Temperature Co-fired Ceramics) and LTCC (Low Temperature Co-fired Ceramics). $Al_2O_3$, AlN, SiC or the like may be used for materials usable as HTCC and these materials are produced by firing at a temperature as high as 1500° C. or higher. Therefore, Ag or Cu, which has a low melting point and low resistance although having high material strength, cannot be used for the conductive material to be used for an inner layer of the substrate and Mo or W, which has a high melting point and high resistance, has to be used. Accordingly, the conductor loss becomes high and although usable for a vehicular circuit substrate and low frequency sensor substrate, HTCC are difficult to be used for a high frequency module for a cellular phone or the like.

On the other hand, LTCC are possible to be sintered at a low temperature about 950° C. to 1000° C. so as not to melt Ag or Cu by combining a large quantity, about 50%, of a low melting point glass material with mainly ceramic raw materials (filler). Since simultaneous firing with a high conductivity noble metal material such as Ag and Cu is possible, the conductor loss can be lowered and LTCC can be usable for a high frequency module for a cell phone or the like. Further, due to decrease of the firing temperature, the energy to be consumed at the time of production can be reduced.

However, since LTCC contain a large quantity of glass, they are disadvantageous in the mechanical strength and chemical resistance as compared with HTCC. Particularly, the multilayer ceramic substrate tends to be made thinner as mobile appliances have been made more miniaturized and multi-functional and therefore insufficient strength of the substrate possibly causes a serious problem in the reliability of a product. To solve such a problem, addition of $TiO_2$ and CuO or $Nb_2O_5$ and CuO has been proposed as a promoter for promoting firing in place of glass for materials having a lowered firing temperature without so much decreasing the content of $Al_2O_3$ (Japanese Patent No. 3220360, Japanese Patent Application Laid-Open (JP-A) No. 2004-256384, 9-67159, 9-235154, 9-278516, 2003-95732, and 2005-145722).

However, in the case of using the above-mentioned additive, the sinter-ability at a temperature as low as 1000° C. or lower at which Ag or Cu is usable as a wiring material is still insufficient. Accordingly, a costly Ag—Pd material or the like has to be used as a wiring material and LTCC are not so easily made usable for a high frequency module of mobile appliances and a substrate in which passive elements are mounted with high density.

SUMMARY OF THE INVENTION

An object of the present invention is to provide a ceramic green sheet which can be sintered at a low temperature and has a high strength and a ceramic substrate obtained by sintering the ceramic green sheet.

The ceramic green sheet of the invention is a ceramic green sheet containing an inorganic powder and an organic resin and characterized in that the inorganic powder contains 72 to 98% by weight of aluminum oxide, 1 to 12% by weight of copper oxide, 0.1 to 3% by weight of titanium oxide, and 0.25 to 10% by weight of silicon oxide based on 100% by weight of the total weight of the inorganic powder.

Aluminum oxide in the invention may include oxides of aluminum such as $Al_2O_3$ and AlO. Copper oxide may include oxides of copper such as CuO and $Cu_2O$. Titanium oxide may include oxides of titanium such as $TiO_2$. Silicon oxide may include oxides of silicon such as $SiO_2$.

With respect to the ceramic green sheet of the invention, as described above, since aluminum oxide, copper oxide, titanium oxide, and silicon oxide are contained, a ceramic substrate with low porosity can be obtained even by firing at a relatively low temperature. Accordingly, it is made easy to obtain a ceramic substrate having a high strength.

On the contrary to the above-mentioned conventional LTCC having structure in which a ceramic filler is dispersed in a matrix of a glass component, a ceramic substrate formed by firing ceramic green sheets of the invention is supposed to have structure in which materials composed of mixtures or compounds of firing aids (copper oxide, titanium oxide, silicon oxide), which are accessory components, or one or more reaction of a ceramic mother component and firing aids are dispersed mainly in the peripheries of the grain boundaries of polycrystalline ceramic (aluminum oxide). Since the ceramic substrate formed by firing ceramic green sheets of the invention has such a structure, the ceramic substrate is supposed to have high material strength and high thermal conductivity.

In the ceramic green sheet of the invention, since aluminum oxide is contained as a main component and copper oxide, titanium oxide, and silicon oxide are contained as accessory components, each ceramic green sheet is made sinter-able at a low temperature while the content of aluminum oxide is heightened. Accordingly, if the content of each accessory component is lowered, it possibly becomes difficult to carry out sintering at a low temperature. Further, if the content of each accessory component is increased, the strength of a ceramic substrate obtained by sintering may be possibly decreased. Similarly, if the content of aluminum oxide, the main component, is lowered than the above-mentioned range, the strength of the ceramic substrate to be obtained by sintering may be possibly decreased. On the other hand, if it is higher than the above-mentioned range, since the contents of the above-mentioned accessory components are relatively decreased, the sintering at a low temperature sometimes becomes impossible.

With respect to the green sheets of the invention, it is preferable to further contain at least one of boron oxide and bismuth oxide. Containing at least one of boron oxide and bismuth oxide makes low temperature sintering possible to further heighten the sintering density after firing.

The content of boron oxide and bismuth oxide is preferably 1 to 3% by weight based on 100% by weight of the total weight of inorganic powders including the boron oxide and bismuth oxide.

Further, with respect to the green sheets of the invention, silicon oxide and boron oxide may be contained as borosilicate glass. Borosilicate glass is glass generally defined by the formula, $B_2O_3$—$SiO_2$—$R_2O$ (R denotes an alkali metal). The content of borosilicate glass is preferably 0.5 to 10% by weight based on 100% by weight of the total weight of inorganic powders.

A softening point of the borosilicate glass is preferable to be 900° C. or lower. However, even if the softening point exceeds 900° C., it is possible to carry out sintering. If the softening point is increased, in the case of sintering the glass together with a wiring material, the sintering shrinkage properties of a conductive paste of the wiring material and the borosilicate glass tend to differ each other, resulting in occurrence of deformation. Further, the effect of promoting sintering is improved more as the softening point is lower than the sintering temperature. From these points of view, the softening point is preferably from 500° C. or higher to 900° C. or lower.

Silicon oxide and boron oxide may be used in place of borosilicate glass. Generally, at an $Al_2O_3$ sintering temperature or lower, silicon oxide and boron oxide are mixed and the oxides become in the same state as the borosilicate glass state near the sintering temperature.

It is preferable that a conductive paste containing any of Ag, Ag—Pd, and Cu is formed on the surface of the ceramic green sheets of the invention. Such a conductive paste is fired simultaneously with the ceramic green sheets and forms a conductive layer on the ceramic substrate surface or inside of the ceramic substrate.

The ceramic substrate of the invention is characterized in that the ceramic substrate is formed by firing the above-mentioned ceramic green sheets of the invention.

The ceramic substrate of the invention can be produced by firing the above-mentioned ceramic green sheets at a relatively low temperature, for example, about 950° C. to 1000° C. Since ceramic green sheets of the invention are used, the ceramic substrate of the invention can be provided with low porosity and high strength.

Further, the ceramic substrate of the invention may be a multilayered ceramic substrate produced by layering a plurality of the ceramic green sheets of the invention and firing the layered sheets.

As described above, a conductive paste is applied and formed on the ceramic green sheets and fired simultaneously with the ceramic green sheets, so that a conductive layer can be formed at least on the surface and inside of the ceramic substrate. The ceramic substrate having wiring in the substrate surface or inside of the substrate can be obtained by forming the conductive layer. The ceramic substrate having such a structure can be used for high frequency modules and passive device-mounted electronic parts.

The ceramic green sheets of the invention can be sintered at a low temperature and obtain high strength after firing. Accordingly, since it is made easy to form wiring patterns of a low resistant conductive material such as Ag or Cu, the conductor loss can be suppressed.

Further, since the ceramic substrate is provided with low resistant wiring patterns and high strength, the ceramic substrate can be applied to electronic parts such as a high frequency module for a cell phone or the like.

DETAILED DESCRIPTION OF THE PREFERRED EMBODIMENTS

Figure 1:
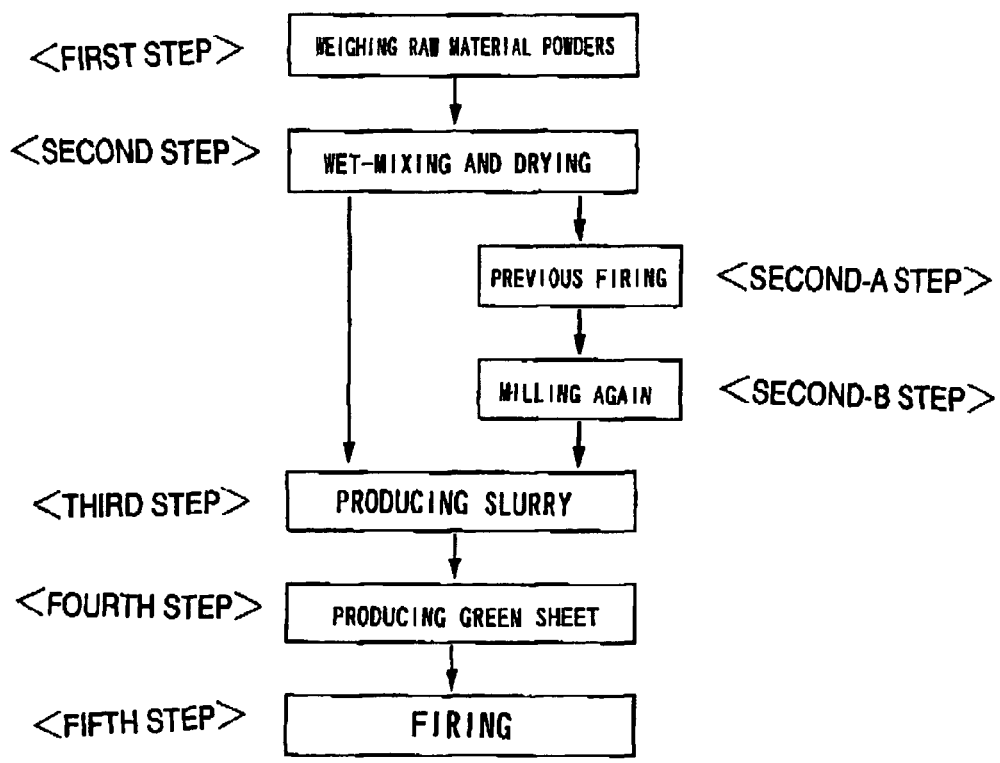
FIG. 1 is a flow diagram showing one example of production process of a ceramic green sheet of the invention and a ceramic substrate obtained by firing the sheet.

FIG. 1 is a flow diagram showing one example of production process of a ceramic green sheet of the invention and a ceramic substrate formed by firing the sheet. With reference to FIG. 1, the ceramic green sheet of the invention and the production process of a multilayered ceramic substrate formed by firing the ceramic green sheet will be described.

<First Step>

As shown in FIG. 1, raw material powders such as aluminum oxide powder, copper oxide powder, titanium oxide powder, and silicon oxide powder are respectively weighed. In the case where boron oxide, bismuth oxide and borosilicate glass are to be used, these raw material powders are also weighed.

<Second Step>

Successively, a solvent such as water or isopropyl alcohol (IPA) is added to these raw material powders and the mixture is wet mixed by a ball mill or the like for about 15 hours and successively removing the added solvent by drying.

<Third Step>

Next, an organic resin such as polyvinyl alcohol (PVA) or polyvinyl butyral (PVB) and a solvent such as IPA are added to and mixed with the dried raw material mixture. Accordingly, a slurry containing the inorganic powders, organic resin, and the solvent is produced.

<Fourth Step>

Next, the slurry is applied to a PET (polyethylene terephthalate) film by doctor blade method or the like and dried to form the mixture into a sheet-like form with a thickness of about 50 μm to 200 μm. Accordingly, a ceramic green sheet containing the inorganic powders and the organic resin is produced.

<Fifth step>

Finally, after being subjected to binder removal treatment at about 500° C., the above-mentioned ceramic green sheet is fired at a temperature of 800° C. to 1100° C. to form a ceramic substrate.

Hereinafter, the invention will be described along with practical Examples, however it is not intended that the invention be limited to the illustrated Examples.

EXAMPLES 1 TO 7 AND COMPARATIVE EXAMPLES 1 TO 5

As raw material powders were used aluminum oxide ($Al_2O_3$) powder with a particle diameter of 0.5 μm and purity of 99.99%, reagent-grade titanium oxide ($TiO_2$) powder and copper oxide powder having purity of 99.9% or more, and common reagent-grade borosilicate glass powder (composition ratio: 50% of silicon oxide ($SiO_2$), 16.7% of boron oxide ($B_2O_3$), and 33.3% of other components: softening point 770° C.) and these powders were weighed to adjust them at prescribed composition ratios (% by weight) shown in Table 1 and mixed by a ball mill using zirconia balls. Alumina balls may be used in place of the zirconia balls. In Example 7 (sample No. 11) and Comparative Example 5 (sample No. 12), $SiO_2$ powders and $B_2O_3$ powders were used at the ratios shown in Table 1 in place of borosilicate glass powders.

<Production of Pellet Samples for Porosity Measurement>

The raw material powders were dried after crushing by the ball mill, and 100 parts by weight of these raw material powders were mixed with an aqueous PVA solution containing 1.3 parts by weight of PVA as a binder and granulated. The resulting powder was press-formed into pellet-like form with a diameter of 15 mm and a thickness of 1 mm and formed bodies were subjected to binder removal treatment by heating treatment at 400° C. for 2 hours and successively fired at 950° C., 1000° C., and 1050° C. for 2 hours. The porosity of obtained sintered bodies were measured according to JIS-Z 2505 and calculated by Archimedes' method. The results are shown in Table 1. The porosity shows the existence ratio of pores inside of each ceramic sintered body and it is confirmed that as the porosity is lower, the sintering is promoted more and the strength is more improved.

Further, with respect to each obtained sintered body, before and after sintering, the ceramic composition was analyzed by x-ray fluorescence spectrometry. As a result, it is confirmed that the mixing composition of raw material powders and the ceramic composition after sintered were almost the same.

The porosity was practically measured by the following method. At first, a dry weight $W_1$ of each obtained sintered body was measured and successively the sintered body pellet was boiled in pure water for 3 hours or longer and a weight $W_2$ of the water-containing pellet in water was measured. Further, a weight $W_3$ of each sintered pellet containing water in air was measured. The porosity was calculated according to the following equation:

$$\text{Porosity (\%)} = [(W_3 - W_1)/(W_3 - W_2)] \times 100$$

TABLE 1

| Sample No. | Composition Ratio | | | Borosilicate Glass (Composition Ratio: $SiO_2$:50%, $B_2O_3$:16.7%, and Other Components:33.3%) | | Porosity | | | |
|---|---|---|---|---|---|---|---|---|---|
| | $Al_2O_3$ | CuO | $TiO_2$ | $SiO_2$ | $B_2O_3$ | 950° C. | 1000° C. | 1050° C. | |
| 1 | 100% | | | | | 47% | 47% | 47% | Comp. Ex. 1 |
| 2 | 98% | 1% | 0.5% | 0.25% | 0.5% 0.0835% | 48% | 9% | 0% | Ex. 1 |
| 3 | 90% | | | 5% | 10% 1.67% | 48% | 46% | 46% | Comp. Ex. 2 |
| 4 | 90% | 5% | 5% | | | 42% | 30% | 2% | Comp. Ex 3 |
| 5 | 90% | 5% | | 2.5% | 5% 0.835% | 45% | 43% | 38% | Comp. Ex. 4 |
| 6 | 90% | 4% | 3% | 1.5% | 3% 0.501% | 8% | 0% | 0% | Ex. 2 |
| 7 | 90% | 6% | 1% | 1.5% | 3% 0.501% | 45% | 25% | 0% | Ex. 3 |
| 8 | 90% | 6% | 3% | 0.5% | 1% 0.167% | 35% | 9% | 0% | Ex. 4 |
| 9 | 90% | 8% | 1% | 0.5% | 1% 0.167% | 46% | 25% | 0% | Ex. 5 |
| 10 | 80% | 12% | 3% | 2.5% | 5% 0.835% | 5% | 0% | 0% | Ex. 6 |
| 11 | 80% | 5% | 2% | 3% | 10% | 19% | 0% | 0% | Ex. 7 |
| 12 | 70% | 9% | 3% | 5% | 13% | 18% | 0% | 0% | Comp. Ex. 5 |

As shown in Table 1, in the case of Comparative Example 1 using only $Al_2O_3$, the porosity was 47% in all of the cases of firing at 950° C. to 1050° C. to find that sintering was insufficient. Further, with respect to Comparative Example 2 (sample No. 3) in which borosilicate glass alone was added to $Al_2O_3$, the porosity was 40% or higher to also find that sintering was insufficient. With respect to Comparative Example 3 (sample No. 4) in which CuO and $TiO_2$ were added to $Al_2O_3$, the porosity was high at a firing temperature of 1000° C. or lower to find that sintering was insufficient. With respect to Comparative Example 4 (sample No. 5) in which CuO and borosilicate glass were added to $Al_2O_3$, the porosity were high at sintering temperature of 950° C. to 1050° C. to find that sintering was insufficient.

On the contrary to the above-mentioned results of Comparative Examples 1 to 4, with respect to Example 1 (sample No. 2) in which CuO, $TiO_2$ and borosilicate glass were added to $Al_2O_3$, low porosity was obtained at firing temperature of 1000° C. and 1050° C. and it is understood that low temperature sintering was possible.

Further, from the results of Examples 2 to 6 (sample No. 6 to 10), it is understood that sintering at a temperature as low as 1000° C. or lower was possible in the case the content of $TiO_2$ was 0.5 to 3% by weight, the content of CuO was 1 to 12% by weight, and the content of borosilicate glass was 0.5 to 5% by weight.

Further, it is understood that low temperature sintering was possible in Example 1 in which the content of $Al_2O_3$ was as high as 98% by weight and also in Example 6 in which the content of $Al_2O_3$ was as low as 80% by weight.

It is also understood that low temperature sintering was possible in Example 7 in which $SiO_2$ and $B_2O_3$ were used in place of borosilicate glass.

Although low temperature sintering was possible in Comparative Example 5 in which the content of $Al_2O_3$ was 70% by weight, as described below, the transverse rupture strength was lowered and the strength as a ceramic substrate was insufficient.

EXAMPLES 8 TO 13 AND COMPARATIVE EXAMPLES 6 TO 9

As raw material powders were used aluminum oxide ($Al_2O_3$) powder with a particle diameter of 0.5 μm and purity of 99.99%, reagent-grade $TiO_2$ powder, CuO powder, and $SiO_2$ powder respectively having purity of 99.9% or more, and these powders were weighed to adjust them at prescribed composition ratios shown in Table 2 (% by weight) and mixed by a ball mill using zirconia balls. In addition, alumina balls may be used in place of the zirconia balls.

<Production of Pellet Samples for Porosity Measurement>

The raw material powders were dried after crushing by the ball mill, and 100 pars by weight of these raw material powders were mixed with a PVA aqueous solution containing 1.3 parts by weight of PVA as a binder and granulated. The resulting powder was press-formed into pellet-like form with a diameter of 15 mm and a thickness of 1 mm and formed bodies were subjected to binder removal by heating treatment at 400° C. for 2 hours and successively fired at 950° C., 1000° C., and 1050° C. for 2 hours. The porosity of obtained sintered bodies were measured in the above-mentioned manner. The results are shown in Table 2.

Further, with respect to each obtained sintered body, before and after sintering, the ceramic composition was analyzed by x-ray fluorescence spectrometry. As a result, it is confirmed that the mixing composition of raw material powders and the ceramic composition after sintered were almost the same.

As shown in Table 2, in the case of Comparative Example 6 using only $Al_2O_3$, the porosity was 47% in all of the cases of firing at 950° C. to 1050° C. to find that sintering was insufficient. Further, in the case of Comparative Example 7 (sample No. 15) in which CuO and $TiO_2$ were added to $Al_2O_3$, the porosity was high at a firing temperature of 1000° C. or lower to find that sintering was insufficient. In the case of Comparative Example 8 (sample No. 16) in which CuO and $SiO_2$ were added to $Al_2O_3$, the porosity was high at a firing temperature of 950° C. to 1050° C. to find that sintering was insufficient.

On the contrary to the above-mentioned results of Comparative Examples 6 to 8, in the case of Example 8 (sample No. 14) in which CuO, $TiO_2$ and $SiO_2$ were added to $Al_2O_3$, low porosity was obtained at firing temperature of 1000° C. and 1050° C. and it is understood that low temperature sintering was possible.

Further, from the results of Examples 9 to 13 (sample No. 17 to 21), it is understood that sintering at a temperature as low as 1000° C. was possible in the case the content of $TiO_2$ was 0.5 to 3% by weight, the content of CuO was 1 to 12% by weight, and the content of $SiO_2$ was 0.5 to 5% by weight.

Further, it is also understood that low temperature sintering was possible in Example 8 in which the content of $Al_2O_3$ was as high as 98% by weight and in Example 13 in which the content of $Al_2O_3$ was as low as 80% by weight.

Although low temperature sintering was possible in Comparative Example 9 in which the content of $Al_2O_3$ was 70% by weight, as described below, the transverse rupture strength was lowered and the strength as a ceramic substrate was insufficient.

EXAMPLES 14 TO 21 AND COMPARATIVE EXAMPLES 10 TO 13

Pellet samples for porosity measurement were produced in the same manner as described above, except that respective raw material powders, that is, $Al_2O_3$, CuO, $TiO_2$, $SiO_2$, $B_2O_3$, and $Bi_2O_3$, were mixed in prescribed compositions (% by weight) shown in Table 3 and the porosity was measured. In Table 3, "CuO+$TiO_2$+$SiO_2$" means the total amounts of the respective oxides in the case the respective powders of CuO, $TiO_2$, and $SiO_2$ were mixed at, for example, a ratio by weight of (CuO:$TiO_2$:$SiO_2$)=4:3:3.

With respect to obtained sintered bodies, before and after sintering, the ceramic composition was analyzed by x-ray fluorescence spectrometry. As a result, it is confirmed that the mixing composition of raw material powders and the ceramic composition after sintered were almost the same.

TABLE 2

| Sample No. | Composition Ratio (% by Weight) | | | | Porosity | | | |
|---|---|---|---|---|---|---|---|---|
| | $Al_2O_3$ | CuO | $TiO_2$ | $SiO_2$ | 950° C. | 1000° C. | 1050° C. | |
| 13 | 100% | | | | 47% | 47% | 47% | Comp. Ex. 6 |
| 14 | 98% | 1% | 0.5% | 0.5% | 46% | 9% | 0% | Ex. 8 |
| 15 | 90% | 5% | 5% | | 42% | 30% | 2% | Comp. Ex. 7 |
| 16 | 90% | 5% | | 5.0% | 46% | 45% | 36% | Comp. Ex. 8 |
| 17 | 90% | 4% | 3% | 3.0% | 43% | 2% | 0% | Ex. 9 |
| 18 | 90% | 6% | 1% | 3.0% | 44% | 4% | 0% | Ex. 10 |
| 19 | 90% | 6% | 3% | 1.0% | 42% | 1% | 0% | Ex. 11 |
| 20 | 90% | 8% | 1% | 1.0% | 46% | 7% | 0% | Ex. 12 |
| 21 | 80% | 12% | 3% | 5.0% | 38% | 0% | 0% | Ex. 13 |
| 22 | 70% | 13% | 5% | 12% | 27% | 0% | 0% | Comp. Ex. 9 |

TABLE 3

| Sample No. | Composition Ratio (% by Weight) | | | | | | Porosity | | | |
|---|---|---|---|---|---|---|---|---|---|---|
| | $Al_2O_3$ | CuO + TiO₂ + SiO₂ | | | $B_2O_3$ | $Bi_2O_3$ | 950° C. | 1000° C. | 1050° C. | |
| | | CuO | TiO₂ | SiO₂ | | | | | | |
| 23 | 90% | | | | 10% | | 35% | 34% | 32% | Comp. Ex. 10 |
| 24 | 90% | | | | | 10% | 36% | 30% | 28% | Comp. Ex. 11 |
| 25 | 90% | 4% | 3.0% | 3.0% | | | 43% | 2% | 0% | Ex. 14 |
| 26 | 90% | 3.6% | 2.7% | 2.7% | 1% | | 35% | 2% | 0% | Ex. 15 |
| 27 | 90% | 3.2% | 2.4% | 2.4% | 2% | | 32% | 1% | 0% | Ex. 16 |
| 28 | 90% | 3.2% | 2.4% | 2.4% | | 2.0% | 31% | 2% | 0% | Ex. 17 |
| 29 | 90% | 2.8% | 2.1% | 2.1% | 3% | | 33% | 1% | 0% | Ex. 18 |
| 30 | 80% | 5% | 2% | 3% | 10% | | 19% | 0% | 0% | Ex. 19 |
| 31 | 70% | 9% | 3% | 5% | 13% | | 18% | 0% | 0% | Comp. Ex. 12 |
| 32 | 80% | 12% | 3% | 0.5% | | 4.5% | 10% | 0% | 0% | Ex. 20 |
| 33 | 80% | 5% | 2% | 3% | | 10% | 0% | 0% | 0% | Ex. 21 |
| 34 | 70% | 13% | 3% | 7% | | 7% | 0% | 0% | 0% | Comp. Ex. 13 |

As shown in Table 3, in the case of Comparative Example 10 (sample No. 23) in which $B_2O_3$ was added to $Al_2O_3$ and Comparative Example 11 (sample No. 24) in which $Bi_2O_3$ was added to $Al_2O_3$, the porosity was 20% or higher at 1050° C. to find that sintering was insufficient.

It is found that as compared with the porosity of Example 14 (sample No. 25) in which CuO, $TiO_2$, and $SiO_2$ were added to $Al_2O_3$, the porosity of Examples 15 to 21 (sample No. 26 to 30 and 32 to 33) in which $B_2O_3$ or $Bi_2O_3$ as a sintering aid was added was lowered at a firing temperature of 950° C. and 1000° C. Accordingly, it is understood that addition of $B_2O_3$ and/or $Bi_2O_3$ as a sintering aid further promoted sintering.

In the case of Comparative Examples 12 and 13 in which the content of $Al_2O_3$ was 70% by weight, the porosity was low and thus the low temperature sintering was possible, however as described below, the transverse rupture strength was lowered and the strength as a ceramic substrate was insufficient.

EXAMPLES 22 TO 30 AND COMPARATIVE EXAMPLES 14 TO 18

<Production of Pellet Samples for Porosity Measurement>

As raw material powders were used $Al_2O_3$ powder with a particle diameter of 0.5 μm and purity of 99.99%, reagent-grade $TiO_2$ powder, CuO powder, $Bi_2O_3$ powder respectively having purity of 99.9% or more, and reagent-grade borosilicate glass powder (composition ratio: $SiO_2$:77.7%, $B_2O_3$: 19.4%, and other components: 2.9%:softening point 760° C.). These powders were weighed to adjust them at prescribed composition ratios (% by weight) shown in Table 4 and mixed with water and wet-mixed and stirred by a ball mill using zirconia balls for 15 hours. After wet-mixing, the added solvent was removed by drying. In Comparative Examples 17 and 18, $SiO_2$ powder and $B_2O_3$ powder were used in place of borosilicate glass.

The raw material powders were dried after crushing by the ball mill, and 100 parts by weight of these raw material powders were mixed with a PVA aqueous solution containing 1.3 parts by weight of PVA as a binder and granulated. The resulting powder was press-formed into pellet-like form with a diameter of 15 mm and a thickness of 1 mm and formed bodies were subjected to binder removal treatment by heating treatment at 400° C. for 2 hours and successively fired at 950° C. and 1000° C. for 2 hours.

Further, with respect to obtained sintered bodies, before and after sintering, the ceramic composition was analyzed by x-ray fluorescence spectrometry. As a result, it is confirmed that the mixing composition of raw material powders and the ceramic composition after sintered were almost the same.

The porosity of each obtained sintered body was also measured according to JIS-Z 2505 in the above-mentioned manner and calculated by Archimedes' method. The results are shown in Table 4.

TABLE 4

| Sample No. | Composition Ratio | | | | | | Porosity | | |
|---|---|---|---|---|---|---|---|---|---|
| | | | | Borosilicate Glass (Composition Ratio: SiO₂:77.7%, B₂O₃:19.4%, and Other Components:2.9%) | | | | | |
| | $Al_2O_3$ | CuO | TiO₂ | $SiO_2$ | $B_2O_3$ | $Bi_2O_3$ | 950° C. | 1000° C. | |
| 35 | 100% | | | | | | 47% | 47% | Comp. Ex. 14 |

TABLE 4-continued

| | Composition Ratio | | | Borosilicate Glass (Composition Ratio: SiO₂:77.7%, B₂O₃:19.4%, and Other Components:2.9%) | | | Porosity | | |
|---|---|---|---|---|---|---|---|---|---|
| Sample No. | Al₂O₃ | CuO | TiO₂ | SiO₂ | B₂O₃ | Bi₂O₃ | 950° C. | 1000° C. | |
| 36 | 90% | 5% | 5% | | | | 42% | 30% | Comp. Ex. 15 |
| 37 | 90% | 4% | 2% | 3% 2.331% | 0.582% | 1% | 3% | 0% | Ex. 22 |
| 38 | 98% | 1% | 0.1% | 0.5% 0.3885% | 0.097% | 0.3% | 6% | 1% | Ex. 23 |
| 39 | 95% | 2% | 1% | 1.9% 1.4763% | 0.3686% | 0.1% | 3% | 0% | Ex. 24 |
| 40 | 95% | 2% | 1% | 1% 0.777% | 0.194% | 1% | 3% | 0% | Ex. 25 |
| 41 | 85% | 6% | 3% | 4.5% 3.4965% | 0.873% | 1.5% | 1% | 0% | Ex. 26 |
| 42 | 80% | 8% | 3% | 7% 5.439% | 1.358% | 2% | 0% | 0% | Ex. 27 |
| 43 | 80% | 4% | 3% | 3% 2.331% | 0.582% | 10% | 2% | 0% | Ex. 28 |
| 44 | 80% | 4% | 3% | 10% 7.77% | 1.94% | 3% | 3% | 0% | Ex. 29 |
| 45 | 80% | 12% | 3% | 3% 2.331% | 0.582% | 2% | 0% | 0% | Ex. 30 |
| 46 | 70% | 12% | 3% | 9% | 3% | 3% | 0% | 0% | Comp. Ex. 16 |
| 47 | 70% | 13% | 5% | 0% | 0% | 12% | 11% | 4% | Comp. Ex. 17 |

As shown in Table 4, as compared with the porosity in the case of using only Al₂O₃ powder (Comparative Example 14: sample No. 35), the porosity was lowered at the respective sintering temperature in the case of adding CuO powder and TiO₂ powder to Al₂O₃ powder (Comparative Example 15: sample No. 36), however the porosity was 20% or higher at a sintering temperature of 1000° C.

On the contrary, in the case of adding CuO powder, TiO₂ powder, Bi₂O₃ powder, and borosilicate powder to Al₂O₃ powder (Examples 22 to 30: sample No. 37 to 45), the porosity of further lowered to 10% or lower was obtained at a sintering temperature of 950° C. and 1000° C.

Further, as it was made clear from the results of Examples 22 to 30 (sample No. 37 to 45), it is found that sintering at a temperature as low as 950° C. was possible in the case of 80 to 98% by weight of Al₂O₃ powder, 1 to 12% by weight of CuO powder, 0.1 to 3% by weight of TiO₂ powder, 0.1 to 10% by weight of Bi₂O₃ powder, and 0.5 to 10% by weight of borosilicate glass.

Further, a low porosity was obtained in the case the content of Al₂O₃ powder was as high as 98% by weight in Example 23 (sample No. 38) and also in the case the content of Al₂O₃ powder was as low as 80% by weight in Examples 27 to 30 (sample No. 42 to 45) and accordingly, it is understood that even if the content of Al₂O₃ powder was considerably changed, it was possible to carry out firing to obtain the porosity of 10% or lower at a temperature as low as 950° C.

Although low temperature sintering was possible and low porosity was obtained in Comparative Examples 16 and 17 in which the content of Al₂O₃ powder was 70% by weight, as described below, the transverse rupture strength was lowered and the strength as a ceramic substrate was insufficient.

<Production of Sample for Strength Evaluation>

Next, slurries were produced using the raw material powders with the same compositions as those of Example 2 (sample No. 6) of Table 1, Example 9 (sample No. 17) of Table 2, and Examples 22 to 30 (sample No. 37 to 45) of Table 4 and mixing 100 parts by weight the powders with an IPA solution containing 12 parts by weight of PVB as a binder. Layered bodies each obtained by layering about 20 of ceramic green sheets obtained using each slurry were fired at a temperature differing in a range from 900° C. to 1050° C. to obtain rod-like ceramic substrates with different porosities and outer size of 35 mm×3.5 mm×0.8 mm (size after firing) after firing.

Each of the obtained ceramic substrates was subjected to porosity measurement in the same manner as the above-mentioned pellet-like ceramic substrates and the transverse rupture strength of each ceramic substrate was measured according to JIS-R 1601 by a three-point bending test. The transverse rupture strength measurement was actually carried out as follows. At first, each ceramic substrate was laid over two knife edges (supporting points) arranged at 30 mm distance in parallel. Next, the middle point of the ceramic substrate between the supporting points was pushed with another knife edge to break the ceramic substrate. The cross head speed was set to be 0.5 mm per second. The load at the moment of breakage was read out by a load sensor connected to the knife edge to calculate the transverse rupture strength.

Figure 3:
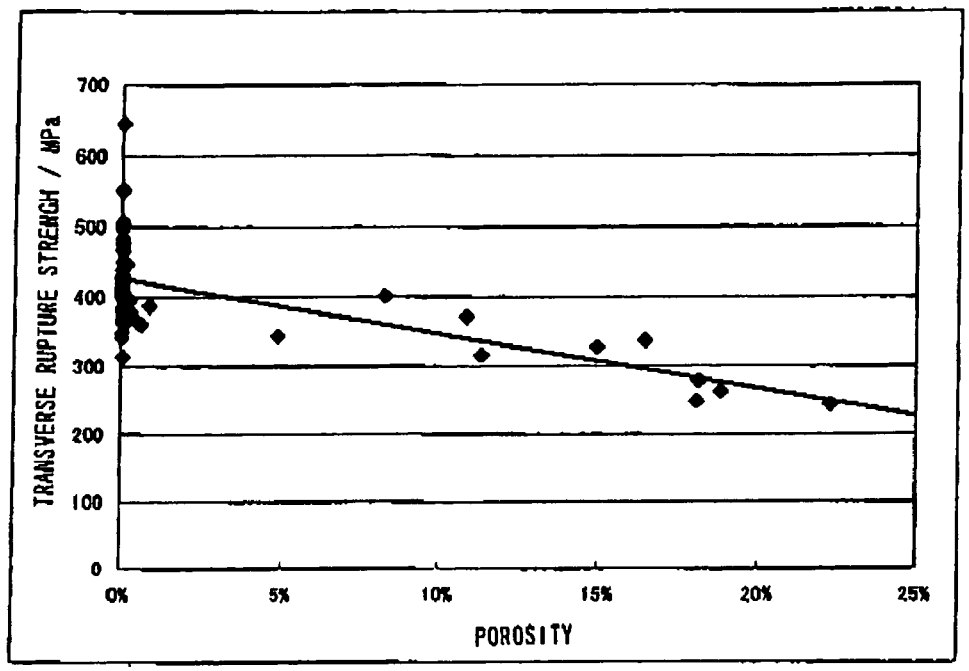
FIG. 3 is a graph showing the correlation of porosity and transverse rupture strength of a sintered body in Example according to the invention.

FIG. 3 shows the correlation of the porosity and the transverse rupture strength of the ceramic substrates subjected to the measurement as described above. As being understood from FIG. 3, in the case the porosity was 20% or lower, the transverse rupture strength of 250 MPa approximately same as that of a conventional LTCC was obtained. Further, with respect to the transverse rupture strength of 300 MPa or higher, which a conventional HTCC to be used practically has, it can be obtained in the case the porosity was 15% or lower.

Figure 4:
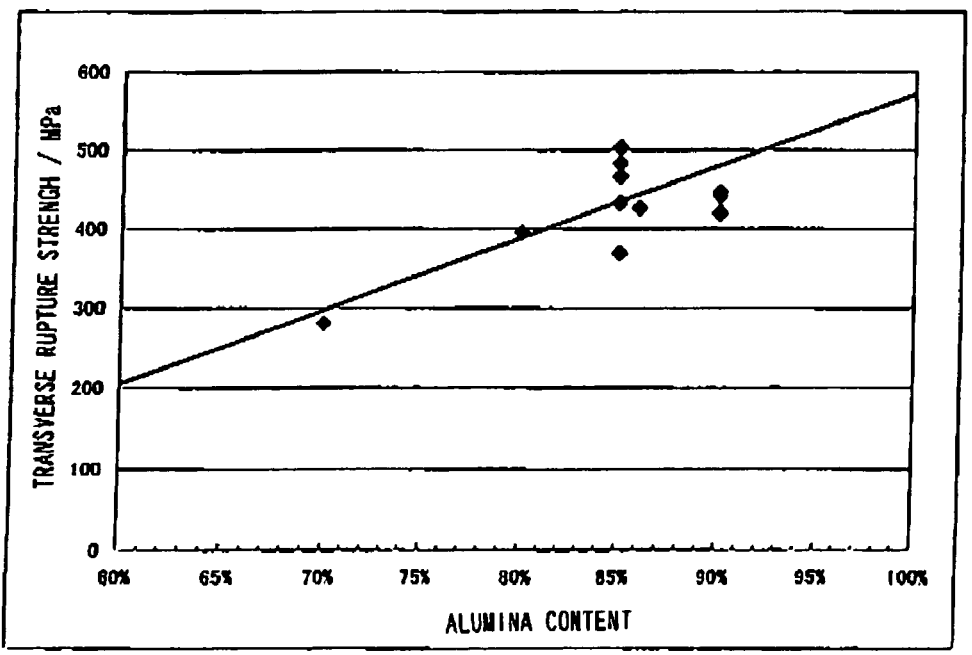
FIG. 4 is a graph showing the correlation of $Al_2O_3$ content and transverse rupture strength in Example according to the invention.

FIG. 4 shows the correlation of the $Al_2O_3$ content and the transverse rupture strength. As being understood from FIG. 4, if the $Al_2O_3$ content was 72% or higher, the transverse rupture strength was higher than 300 MPa and thus practically applicable strength can be obtained.

Although as inorganic powders for raw material powder were used $Al_2O_3$ powder, $TiO_2$ powder, CuO powder, and $SiO_2$ powder in the above-mentioned Examples, other aluminum oxide powders such as AlO or the like and copper oxide powder such as $Cu_2O$ may be used and also may be used titanium oxide powder other than $TiO_2$ and silicon oxide powder other than $SiO_2$. Further, powders of carbonates and nitrates of aluminum, copper, titanium, and silicon and metal powders to be aluminum oxide, copper oxide, titanium oxide, and silicon oxide, respectively, by firing in atmospheric air may be used.

Further, in the above-mentioned embodiments, borosilicate glass having a softening point of 760° C. or 770° C. was used, however without being limited to that, any glass which has a softening point in a range from 500° C. to 900° C. is preferable since sintering process can be carried out from a low temperature. Further, the softening point is more preferably in a range from 560° C. to 830° C.

In the above-mentioned embodiments, although the slurry was produced by mixing the organic resin and the solvent with the dried raw material powder mixture produced in the second step (the third step), as shown in FIG. 1, before addition of the above-mentioned organic resin and solvent, the dried raw material powder mixture may be once previously fired (the second-A step) and successively crushed again by a ball mill or the like (the second-B step). In such a manner, if the third step is carried out successively to the second-A step and the second-B step after the second step, the handling property and the formability of the powders can be further improved.

<Production of Multilayered Ceramic Substrate>

Figure 2:
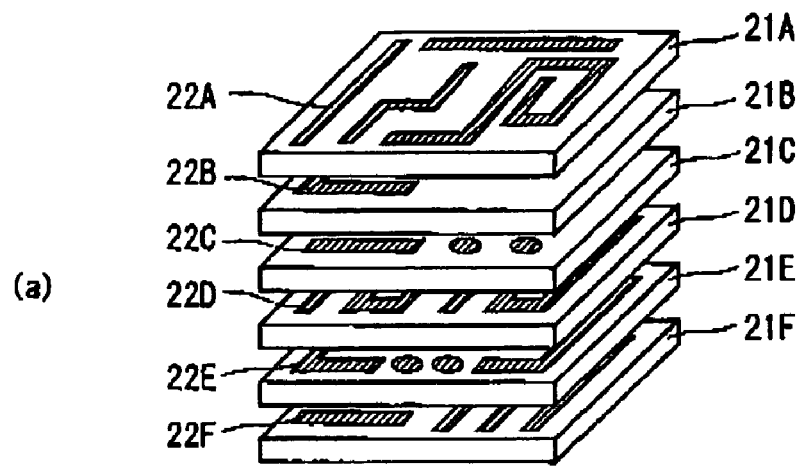
FIG. 2 is a perspective view showing one example of a multilayered ceramic substrate using ceramic green sheets of the invention.
Figure 2:
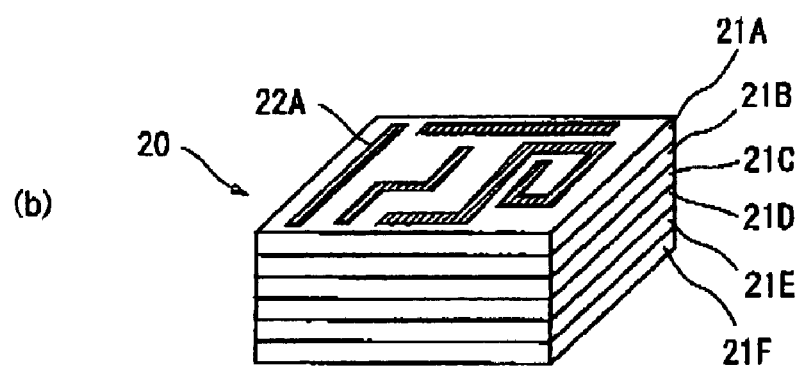
Figure 2:
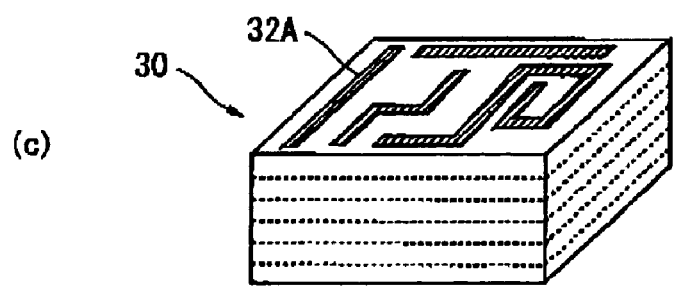

FIG. 2 is a perspective view showing one example of a production method of a multilayered ceramic substrate using ceramic green sheets of the invention.

As shown in FIG. 2A, ceramic green sheets 21A to 21F of the invention are produced and conductive paste containing a silver powder of Ag and Ag—Pd or a conductive material of a copper powder of Cu or the like are printed on these green sheets to form wiring patterns 22A to 22F.

As shown in FIG. 2B, the respective green sheets 21A to 21F are layered and press-bonded by isostatic pressing method to obtain a layered body 20.

As shown in FIG. 2C, the layered body 20 is fired in atmospheric air to obtain a multilayered ceramic substrate 30 comprising ceramic sintered bodies in layers. The firing temperature at that time is about 950° C. in the case the conductive paste 22A to 22F contains the silver powder and about 1000° C. in the case the conductive paste contains the copper powder, so that the conductive paste 22A to 22F can be fired simultaneously with firing of the ceramic green sheets 21A to 21F. A wiring pattern 32A corresponding to the wiring pattern 22A before firing is formed on the multilayered ceramic substrate 30 and wiring patterns corresponding to the wiring patterns 22B to 22F are formed in the inside.

In the case of the multilayered ceramic substrate 30 according to this embodiment, the layered body 20 obtained by layering the above-mentioned ceramic green sheets in a plurality of layers is fired to form the substrate 30. Accordingly, it is made possible to easily obtain a ceramic substrate with a high strength.

Further, since the conductive paste 22A to 22F containing a silver powder or a copper powder and having prescribed patterns are formed on the ceramic green sheets 21A to 21F, the conductive paste 22A to 22F is fired simultaneously with the ceramic green sheets 21A to 21F to form wiring patterns containing silver or copper. Accordingly, it is made possible to easily obtain a ceramic substrate having economical and low resistant wiring patterns using silver or copper and having high strength and low porosity.

Further, since wiring patterns are formed on the surface and inside of the multilayered ceramic substrate, it is made possible to obtain a ceramic substrate usable for high frequency modules and passive element-mounted electron parts.

Although the number of the layered green sheets is 6 in FIG. 2, the multilayered ceramic substrate of the invention is not particularly limited to the number of the layers as shown. Further, the wiring patterns are also not limited to those shown in FIG. 3.

What is claimed is:

1. A ceramic green sheet comprising an inorganic powder and an organic resin, wherein the inorganic powder consists of 72 to 98% by weight of aluminum oxide, 1 to 12% by weight of copper oxide, 0.1 to 3% by weight of titanium oxide, and 0.25 to 10% by weight of silicon oxide based on 100% by weight of the total weight of the inorganic powder, and at least one of boron oxide and bismuth oxide.

2. The ceramic green sheet according to claim 1, wherein a content of the boron oxide and bismuth oxide is 1 to 3% by weight based on 100% by weight of the total weight of the inorganic powder including the boron oxide and bismuth oxide.

3. The ceramic green sheet according to claim 1, wherein a conductive paste containing one of Ag, Ag-Pd, and Cu is formed on a surface of the ceramic green sheet.

4. A ceramic substrate formed by firing the ceramic green sheet according to claim 1.

5. A ceramic substrate formed by laminating the ceramic green sheets according to claim 1, in a plurality of layers and firing the layered body.

6. The ceramic substrate according to claim 4, wherein a conductive layer is formed at least one of a surface and an inside of the ceramic substrate.

* * * * *